(12) United States Patent
Böttcher et al.

(10) Patent No.: US 8,351,477 B2
(45) Date of Patent: Jan. 8, 2013

(54) MODULATION METHOD FOR DIODE-LASER PUMPED LASERS

(75) Inventors: Stefan Böttcher, Lübeck (DE); Axel Kneip, Kiel (DE)

(73) Assignee: Coherent GmbH, Göttingen (DE)

( * ) Notice: Subject to any disclaimer, the term of this patent is extended or adjusted under 35 U.S.C. 154(b) by 190 days.

(21) Appl. No.: 12/841,912

(22) Filed: Jul. 22, 2010

(65) Prior Publication Data

US 2012/0020380 A1    Jan. 26, 2012

(51) Int. Cl.
*H01S 3/00* (2006.01)

(52) U.S. Cl. ............ 372/38.02; 372/21; 372/22; 372/25

(58) Field of Classification Search .............. 372/21–22, 372/38.02

See application file for complete search history.

(56) References Cited

U.S. PATENT DOCUMENTS

| | | |
|---|---|---|
| 6,385,219 B1 | 5/2002 | Sonoda |
| 6,418,154 B1 | 7/2002 | Kneip et al. |
| 6,831,936 B1 | 12/2004 | Smart |
| 2006/0187978 A1* | 8/2006 | Telfair et al. ................ 372/25 |
| 2007/0290960 A1 | 12/2007 | Heo et al. |

FOREIGN PATENT DOCUMENTS

JP    2004-259751 A    9/2004

OTHER PUBLICATIONS

International Search Report and Written Opinion received for PCT Patent Application No. PCT/EP2011/062619, mailed on Jan. 11, 2012, 11 pages.

* cited by examiner

*Primary Examiner* — Dung Nguyen
(74) *Attorney, Agent, or Firm* — Morrison & Foerster LLP (57) ABSTRACT

A method of operating a digitally modulated solid state laser is disclosed. The laser is optically pumped by a current-supply driven diode-laser radiation and with output-power stabilized at a desired value by a light regulator cooperative with a power monitor and the current source is disclosed. When the laser is turned on, the current-source is enabled and the light-regulator is disabled. A current regulator allows current from the current-supply to increase until the monitored power reaches the desired value. At this point, the light regulator is enabled and the light regulator assumes control of the current-supply for maintaining the output-power at the desired level.

10 Claims, 6 Drawing Sheets

MODULATION METHOD FOR DIODE-LASER PUMPED LASERS

TECHNICAL FIELD OF THE INVENTION

The present invention relates in general to diode-laser pumped, digitally modulated, solid-state and optically pumped semiconductor (OPS) lasers. The invention relates in particular to closed-loop control of power output in such lasers.

DISCUSSION OF BACKGROUND ART

In diode-laser pumped, digitally modulated, solid-state lasers and OPS lasers a predetermined output power level is set and analog-controlled automatically by monitoring power output of the laser, comparing that monitored power with a preset level, and adjusting optical pump power by adjusting the drive current of the diode-laser (or array thereof) to maintain the output power at the pre-set level. The laser is digitally modulated by switching the diode-laser current on and off with the "on" current value being that corresponding to the preset power level.

Figure 1:
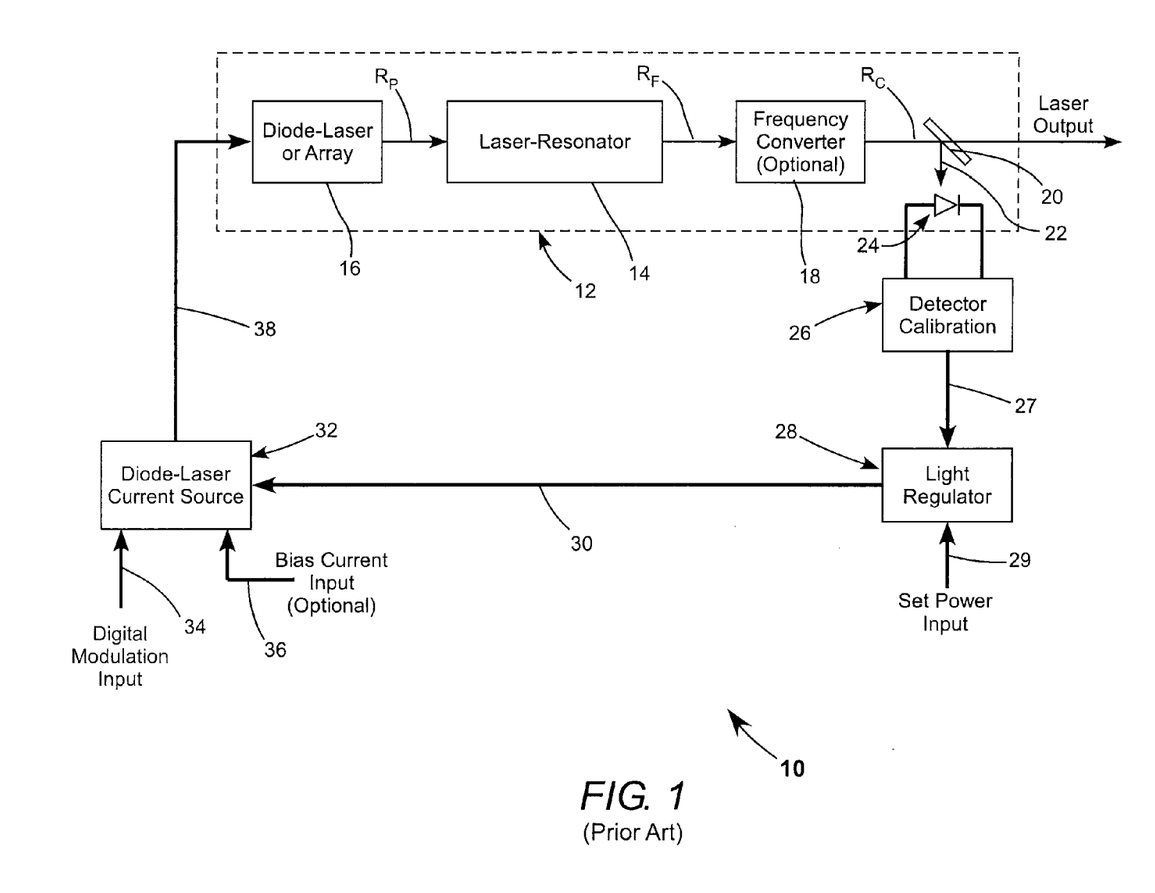

FIG. 1 schematically illustrates a typical arrangement 10 of such a diode-laser pumped, digitally modulated, solid-state laser. Here, laser-radiation paths are designated by fine lines, and electrical connections are designated by bold lines. Arrangement 10 includes a laser optics unit 12, including a laser resonator 14. Resonator 14 includes a solid-state gain medium (not shown) which is energized (pumped) by radiation $R_P$ from a diode-laser radiation source 16. Source 16 can be a single diode-laser or an array of such diode lasers.

In response to the energizing (pumping), laser resonator 14 delivers radiation $R_F$ having a fundamental wavelength characteristic of the gain medium to an optional frequency convertor 18. The frequency convertor can include one or more optically nonlinear crystals arranged to convert radiation $R_F$ to radiation $R_C$ having a wavelength different from the fundamental wavelength. By way of example, the frequency convertor can include one crystal arranged to convert the fundamental-wavelength radiation to second-harmonic (2H) radiation, or two crystals arranged to convert the fundamental-wavelength radiation to third-harmonic (3H) or fourth-harmonic (4H) radiation. Alternatively, frequency-conversion can be carried out by one or more crystals located within the laser resonator. In either case, the frequency-converted radiation provides the laser output-radiation.

A pick-off mirror 20 directs a sample 22, for example about 1%, of the output radiation to a photo-detector (photo-diode) 24 the output of which is connected to a detector calibration circuit 26. The detector calibration circuit 26 sends a signal 27 representative of the instant actual laser output power to light (output radiation) regulation circuitry 28. Light regulation circuitry 28 receives an input signal 29 representative of a desired laser output power. Based on a comparison of signals 27 and 29, light regulation circuitry 28 communicates a signal 30 to a diode-laser current-source 32 which varies the output current 38 of the current-source until the actual output power laser 12 matches the desired output power.

Modulation of the output of laser 12 is achieved by switching the output of the current-source between zero or some predetermined bias (minimum) current 36 and a maximum value determined instantaneously by the signal from the light regulator circuitry. Switching is accomplished by a digital modulation input signal 34 (going low-to-high or high-to-low) from an external source (not shown) such as a microprocessor or a PC. Bias current 36 provides for faster switching (modulation) of laser 12 from an "off" condition to an on condition at the expense of a lower modulation depth or contrast ratio of the laser output.

Figure 2:
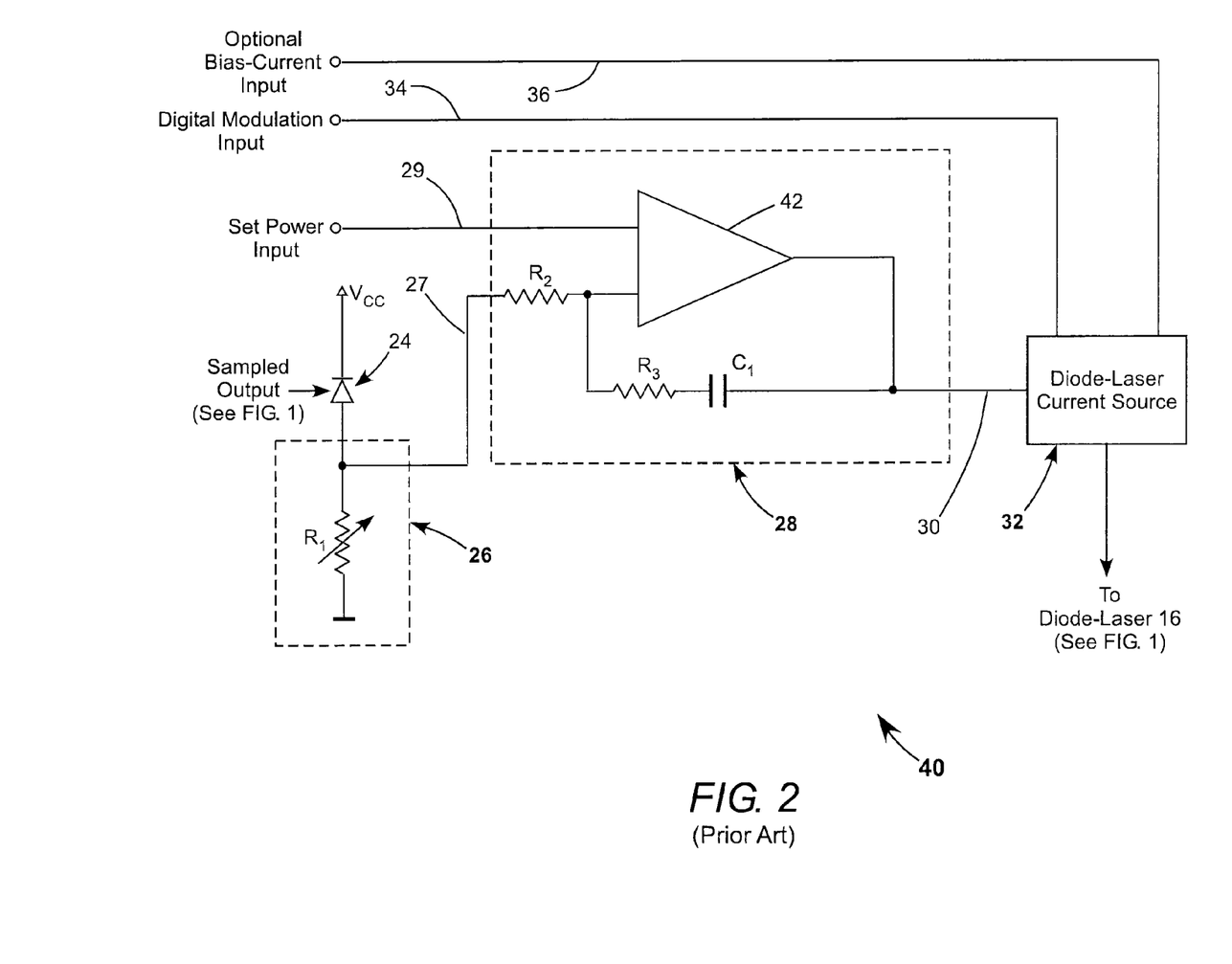
FIG. 2 is an electronic circuit diagram illustrating details of the power monitoring arrangement and the light regulator of the laser of FIG. 1.

FIG. 2 is a functional circuit diagram schematically illustrating details of one example 40 of the light regulation and modulation circuitry of FIG. 1. Here detector calibration circuit 26 includes a variable resistor $R_1$ connected in series with photo-diode 24 of FIG. 1. Signal 27 from the calibration circuitry is connected via a fixed resistor $R_2$ to one input of an operational amplifier 42. The set power signal 29 is connected to the other input of the operational amplifier. Amplifier 42, here, is configured as an integrator, using the combination of $R_3$ and $C_1$ as a feedback loop, to optimize gain at low modulation frequencies. Output 30 of the operational amplifier is communicated to the diode-laser current source 32.

A principal disadvantage of the light-regulation and modulation method of FIGS. 1 and 2 is that the time required for the power output to stabilize at the set level after modulation "turn-on" is inversely dependent on the set level value. By way of example, a diode-laser pumped, external cavity surface-emitting semiconductor laser (OPS laser) having a fundamental wavelength of 976 nm intra-cavity frequency-doubled to provide output radiation having a wavelength 488 nm was tested to determine stabilization time as a function of set-power. Intra-cavity frequency doubling was achieved using a lithium borate (LBO) crystal. At a set output level of 20 milliwatts (mW) power stabilized at the set level at about 20 microseconds (μs) after turn-on. When the set level was reduced to 3 mW, about 200 μs were required for the output to stabilize at the set level.

A primary reason for this inverse dependence of stabilizing time on set-power level is that the gain (response time) of the light regulation circuit is limited by the laser build-up time, thereby reducing the maximum possible gain for higher modulation frequencies. The build-up time is essentially dead time for the light regulation circuit, limiting the rise time of the circuitry.

Figure 3A:
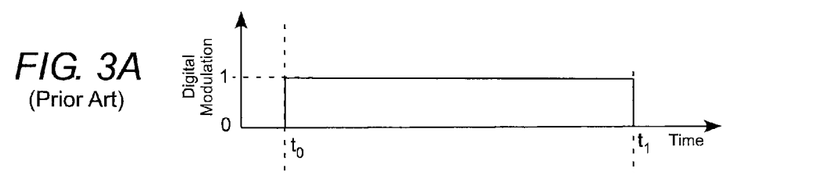
FIG. 3A, FIG. 3B, and FIG. 3C form a timing diagram graphically schematically illustrating initiating and terminating modulation commands, temporal response of the current supply, and temporal response of the output power for two predetermined values of the output power in one modulation cycle of the laser of FIG. 1.
Figure 3B:
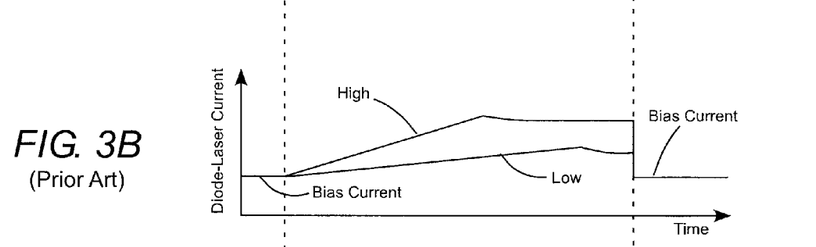
Figure 3C:
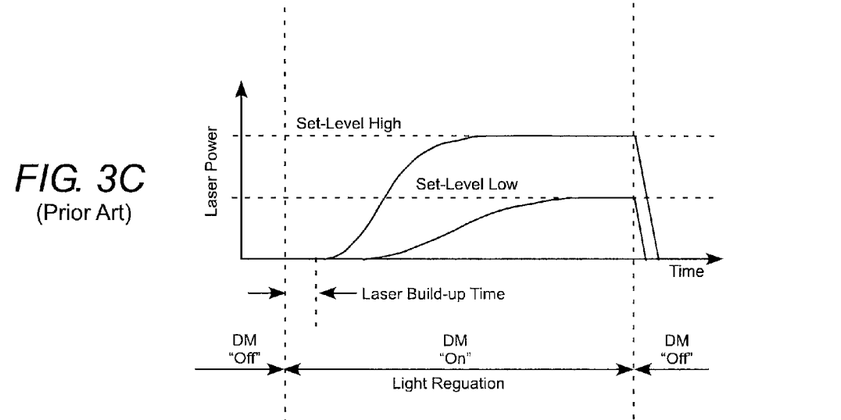

FIG. 3A, FIG. 3B, and FIG. 3C together form a timing diagram schematically illustrating the operation of the apparatus of FIGS. 1 and 2 for one cycle of digital modulation turned on at time $t_0$ and off at time $t_1$. Light regulation is in operation during the whole digital modulation cycle. It can be seen that for a low set-level of laser power current ramp-up and corresponding output power ramp-up to stabilized values take longer than for a higher set-level. This is because the gain of the light regulator amplifier is proportional to the difference between the actual power and the set power.

This, unfortunately, means that stabilized power is delivered for a shorter time during any fixed digital modulation cycle the lower the desired power level. This is unfortunate, because in a digitally modulated laser the modulation frequency is often required to be the same for both low peak power and high peak power.

There is a need for a method of operating a digitally modulated diode-laser pumped solid-state laser such that the delivery time for stabilized laser power is about the same for any desired output power of the laser, and stabilized power is delivered through most of the digital modulation cycle. Preferably, high modulation frequency should be possible, independent of the stabilized level of laser output power.

SUMMARY OF THE INVENTION

In one aspect of the present invention, the invention is directed to a method of controlling power output in a digitally modulated laser energized by a diode-laser radiation source. The diode-laser radiation source is powered by current from a current-source, and output power of the laser is controllable by a light regulator arrangement cooperative with the current-source. The method comprises disabling the light regulator, then, with the light regulator disabled, increasing current from the current-source until output power of the laser reaches a predetermined value. When the laser output power reaches the predetermined value, the light regulator is enabled and the laser output power is controlled by using the light regulator arrangement to control current delivered by the current source.

In a preferred embodiment of the method, the light regulator controls current delivered by the current source such that the laser output power is maintained about constant at the predetermined value. After a predetermined time-period, the laser is turned off by disabling the current-source.

In another aspect of the present invention, optical apparatus comprises a laser and a diode-laser radiation source for energizing the laser to provide laser output power. A current-source is provided for delivering power for powering the diode-laser radiation source. A light regulator arrangement is provided and is cooperative with the current-source for controlling the current delivered by the current-source to the diode-laser radiation source. A power monitor arrangement is provided for monitoring the output power of the laser, the power monitor arrangement being cooperative with the light regulator arrangement. The output power monitor arrangement and the light regulator arrangement are configured such that, when the laser is turned on, the light regulator arrangement is disabled, current from the current-source to the diode-laser radiation source is increased until the monitored laser output power reaches a predetermined value, then the light regulator arrangement is enabled and controls the laser output power by controlling current delivered to the diode-laser radiation source by the current-source.

In a preferred embodiment of the apparatus, a current regulator arrangement is provided for controlling the rate of current increase after the laser is turned on. When the monitored output power reaches the predetermined level and the light regulator arrangement is enabled, the light regulator arrangement takes over control of the laser output power and controls the current delivered by the current source to the diode-laser radiation source such that the output power is maintained about constant at the predetermined level.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1 schematically illustrates a prior-art, digitally modulated, diode-pumped, solid-state laser including a laser resonator energized by a diode-laser radiation source for causing the resonator to deliver fundamental-wavelength radiation, a frequency convertor for converting the fundamental-wavelength radiation to frequency converted output radiation, a current supply for powering the diode-laser radiation source, an arrangement for monitoring the frequency converted output power of the laser resonator and supplying the monitored power to a light regulator, the light regulator arranged to control the current supply such that, when a modulation cycle is initiated in response to one digital command, output power rises to a predetermined value and is maintained at the predetermined value until the modulation cycle is terminated by another digital command.

FIG. 4 schematically illustrates a preferred embodiment of a digitally modulated, diode-pumped, solid-state laser in accordance with the present invention, similar to the laser of FIG. 1, but further including a current regulator and a comparator arrangement cooperative with the power monitor arrangement the light regulator and the current regulator, and wherein on the initiation of a modulation cycle the light regulator is initially disabled, the current regulator allows the diode-laser current from the current supply to rise rapidly and cause a corresponding rapid rise of the monitored frequency-converted output power, the comparator arrangement compares the monitored power with the predetermined power, and, when the rising laser output power reaches the predetermined power, enables the light regulator and transfers control of the current supply to the light regulator for maintaining the output power at the predetermined output power until the modulation cycle is terminated.

DETAILED DESCRIPTION OF THE INVENTION

Figure 4:
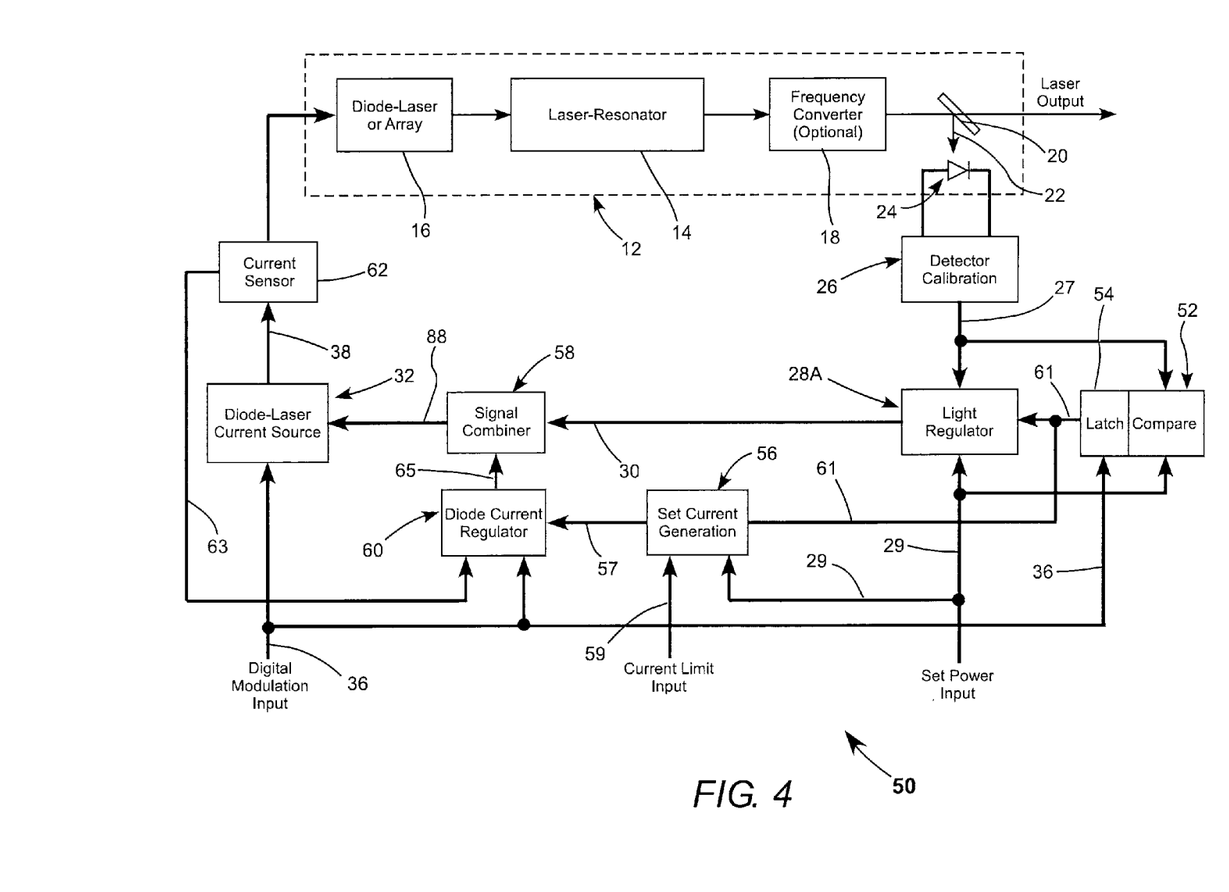

Continuing with reference to the drawings, wherein like components are designated by like reference numerals, FIG. 4 schematically illustrates one preferred embodiment 50 of a digitally modulated diode-pumped solid-state laser in accordance with the present invention. Laser 50 is similar to laser 10 of FIG. 1 but includes additional elements including sensor 62 for monitoring current delivered from diode-laser current source 32 to diode-laser 16. It should be noted, here, that, as discussed above, the combination of the laser resonator and external frequency convertor could be replaced by an intra-cavity frequency-converted resonator without departing from the spirit and scope of the present invention.

A current regulator 60 is responsive to a signal 63 from the current sensor, a signal 57 from a set-current generator 56 and digital modulation input signal 36. The set-current generator signal 57 is switchable, depending on the operational state of the laser, between a current limit input signal 59 and a value which is function of the set power input 29. The switching is accomplished by the output of a combination of a comparator 52 and a latch 54. A signal combiner 58 provides that diode-laser current source 32 can be controlled by a signal 65 from diode current regulator 60 or signal 30 from light regulator 28A.

Figure 5:
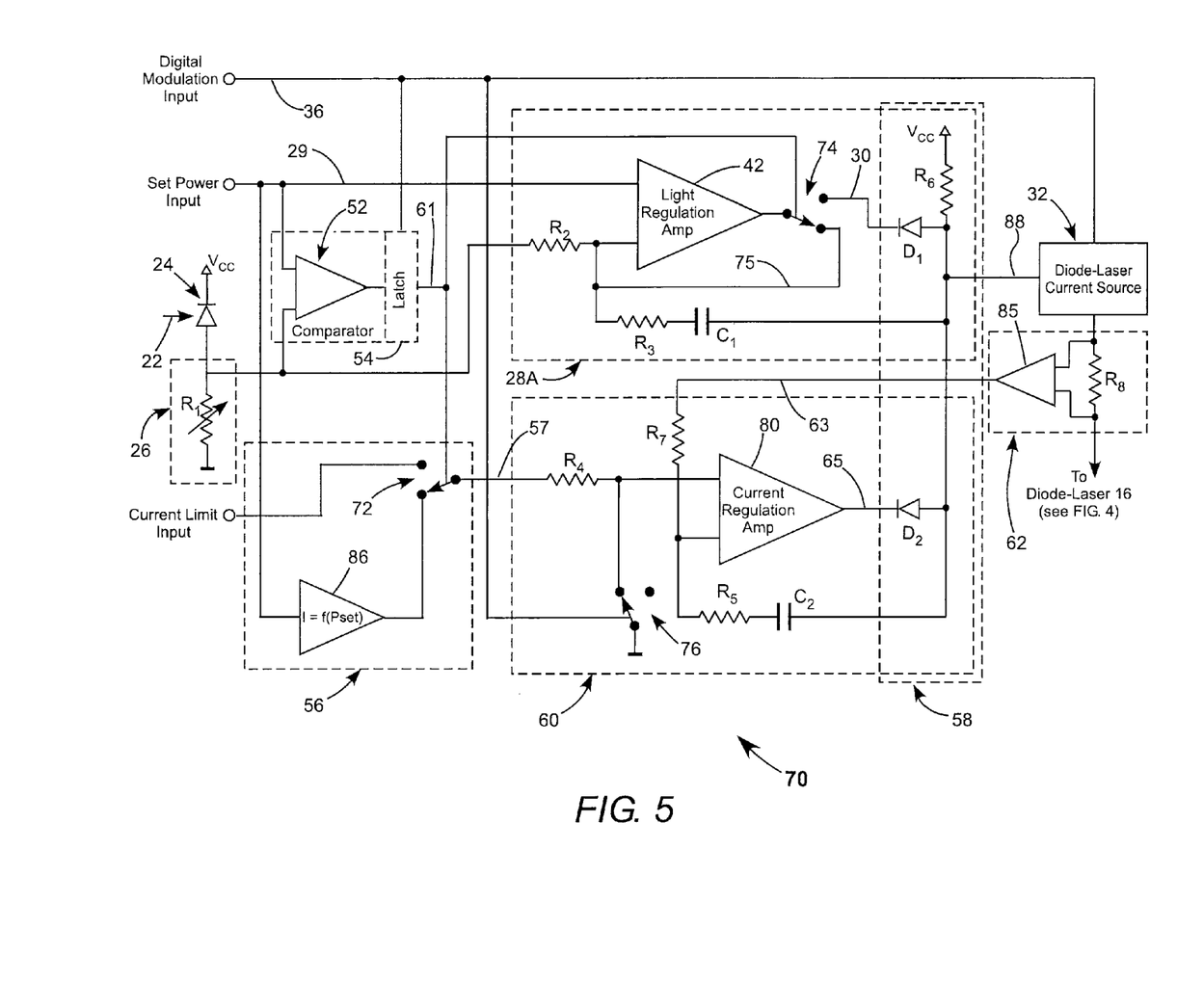
FIG. 5 is a circuit diagram schematically illustrating details of the monitor arrangement, the comparator arrangement, the current regulator, and the light regulator in the laser of FIG. 4.

FIG. 5 depicts more detail of the circuitry of FIG. 4. Here, light regulator 28A is configured similar to light regulator 28 of FIG. 2, with an exception that regulator 28A includes a switch 74 operable by the output of comparator 52 and latch 54 to switch the regulator into an inactive (buffer) mode via a loop 75. Current regulator 60 is configured similar to light regulator 28A and includes a switch 76 operable by the digital modulation input signal for activating or deactivating the regulator. The current regulator includes an operation amplifier 80, resistors $R_4$, $R_5$, and $R_7$, and a capacitor $C_2$. A series combination of resistor $R_5$ and capacitor $C_2$ has the same feedback-loop function as resistor $R_3$ and capacitor $C_1$ in the light regulator. Resistor $R_4$ prevents the output of set current generator 56 from being shorted to ground by switch 76. Resistor $R_7$ determines the gain of the current regulator in combination with R5 and $C_2$.

Current sensor 62 functions by converting sensed current to a voltage across a resistor R8 and amplifying the voltage using an amplifier 85. Signal combiner 58 combines the output of the light regulator and the current regulator into a current-source driving-signal 88 using diodes $D_1$ and $D_2$ and a pull-up resistor $R_6$. Due to the polarity of the diodes a low voltage signal at the output of any one of the regulators will pull down the current source driving signal 88. Set-current generator 56 includes a switch 72 operated by the output of comparator 52 and latch 54. Switch 72 switches the output between the current limit input and a value generated from the set power input by an arithmetic unit 86. Detector calibration unit 26 is configured as described above with reference to the circuitry of FIG. 2.

FIG. 6A, FIG. 6B, FIG. 6C, and FIG. 6D form a timing diagram schematically illustrating operation of laser 50 over one cycle of digital modulation from an "off" state to an "on" state at time $t_0$ and from the "on" state back to the "off" state at time $t_1$. A description of this operation is set forth below with reference to the timing diagram of FIGS. 6A-D and with reference in addition to the circuitry of FIG. 4, and FIG. 5.

Figure 6A:
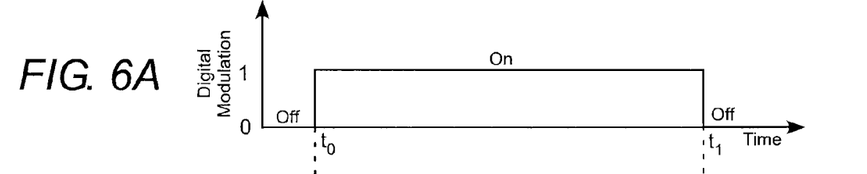
FIG. 6A, FIG. 6B, FIG. 6C, and FIG. 6D form a timing diagram graphically schematically illustrating initiating and terminating modulation commands, temporal response of the current supply, temporal response of the output power and temporal response of the comparator arrangement for two predetermined values of the output power in one modulation cycle of the laser of FIG. 4.
Figure 6B:
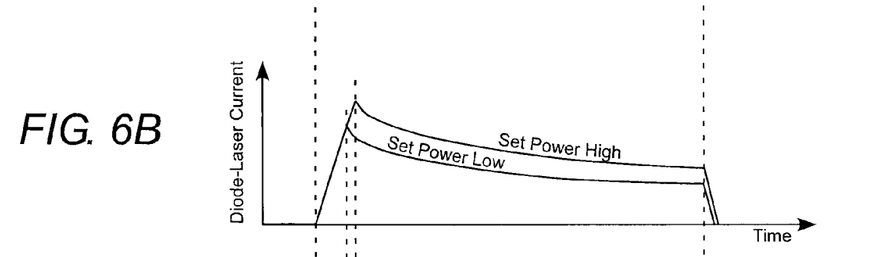

In a general description of the inventive digital modulation method, when digital modulation is switched on at time $t_0$ (see FIG. 6A), the diode-laser current is allowed to rise toward a set value calculated by the arithmetic unit 86 (see FIG. 6B). The calculated current set value is determined by an addition of a constant offset value and a fraction of the set-power value. This is discussed further herein below. The slope of the current rise is determined by the time-constant of the regulator, which is determined, here, by the values of $R_5$ and $C_2$.

After the laser build up time is passed, the laser power begins to rise quickly corresponding to the high current value that has been reached at that time. While the current is rising, in a current regulation mode, the laser power is monitored. When the monitored power reaches the set power, the current-rise is interrupted and control of the diode-laser current is transferred to a light-regulation mode in which the light regulator controls the current supply to provide whatever current is necessary to maintain the laser output power at a constant level. In FIG. 6B, the current is depicted as falling while the power stays constant. This is due to thermal effects as the laser stabilizes. The fall of the current is exaggerated in FIG. 6B for convenience of illustration. At time $t_1$, the diode current is cut off, laser power falls and the light-regulation period is terminated.

In a detailed description of the inventive method, with reference in particular to the circuitry of FIG. 5, in the "off" state of the laser, the diode-laser current is (or has been) switched off by the digital modulation input. Accordingly, there is no diode-laser current sensed by current sensor 62. Switch 74 has set light regulator 28A to a buffer mode as indicated in FIG. 5. The modulation input has caused switch 76 to set the input to current regulator 60 to zero volts as indicated in FIG. 5. This leads to a low voltage output of the current regulator. The output of photodiode 24 is also zero, as laser radiation is not being generated. The comparator/latch (52/54) output has been set to zero by the digital modulation input.

In order to start an "on" cycle of the laser, the digital modulation input is raised from low (digital zero) to high (digital one) with the comparator/latch output remaining, initially, at zero. This digital modulation input enables the diode-laser current-source, corresponding to input from current regulator 60. Switch 76 opens and transmits the set-current signal from set-current generator 56 to current regulator 60. This set-current signal is calculated by arithmetic unit 86 of the set current-generator from the set power value and an additional offset value according to a predetermined function of the laser set power as a function of diode current. The predetermined function can be readily determined by experiment for any laser. The offset value provides that the calculated value is higher than the highest anticipated current-value required for the set power level, but is less than the current-limit. The diode-laser current rises, as the current regulator is not stabilized, and the set-current value is higher than the actual current being monitored by current-sensor 62.

The comparator/latch combination is activated by the digital modulation input rise from low to high, and begins to compare the set power input signal with the output of laser power monitor 26 (the actual power). When the actual power reaches the set power, the output of comparator 52 will toggle from low to high (digital 0 to digital 1, see FIG. 6D) and the value will be stored by latch 54 until digital modulation goes from high to low (the end of the modulation cycle). The toggling of the comparator changes the status of switches 72 and 74. Changing the status of switch 72 switches the set current for the current regulator from the value calculated by arithmetic unit 86 to the current-limit input value. Changing the status of switch 74 activates the light regulator by switching the regulator from the buffer mode to a free regulator mode.

Signal combiner 58 combines signals 30 (from the light regulator) and 65 from the current regulator in such a way that signal 88 transmitted to diode-laser current source 32 is a function of the minimum value of signals 30 and 65. This means that, provided signal 30 never commands a current above the current set limit, control of the current supply will be only by light regulator 28A, with the current regulator only functioning as a current limiter to protect the laser-diode from excess current.

In this condition, the laser can be defined as having been switched by the comparator from the current regulation mode to a light regulation mode. As this mode-switch occurs essentially instantaneously, at a time when the set power and actual power are equal, the slight overshoot of laser power at the beginning of the light regulation mode period (see FIG. 6C) is minimized. Further, as the light regulator is only activated when the actual power is equal to the set power the value of feedback capacitor $C_1$ can be much lower than in the prior art regulator of FIG. 2. This provides for a much faster regulation response time which would allow for fast analog modulation (if desired) during an "on" period. Output noise, particularly at higher modulation frequencies is also considerably reduced by the use of the smaller capacitor value.

At the end of the digital modulation cycle, the digital modulation input signal goes from high to low. This disables current supply 32 and the current set point is switched back to zero by switch 76. The state of the comparator/latch combination is reset to low (digital zero) which changes back the status of switches 72 and 74 putting the light regulator back in a buffered state, and the set-current generator ready for current regulation at the beginning of a next digital modulation cycle.

Figure 6C:
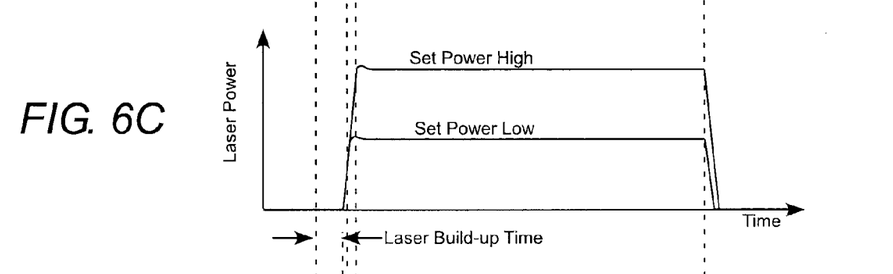
Figure 6D:
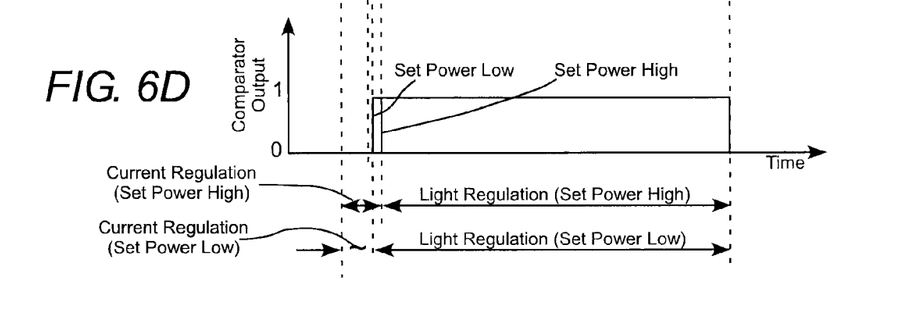

It can be seen from FIG. 6C, that the inventive arrangement and operating method of laser 50, wherein laser output power is controlled first by a current regulator and then by a light regulator, provides that stabilized power at low and high set values begins to be delivered a very short time after the laser build up time has elapsed. This, in turn, provides that, for any chosen duration of a modulation cycle, stabilized power is delivered over a greater portion of the modulation cycle than in a prior-art laser in which laser output power is controlled entirely by a light regulator. Further, the portion of the modulation over which the stabilized power is delivered is only weakly dependent on the peak laser power. What dependence there is the opposite of that of the prior-art laser, with stabilized power being reached slightly faster for lower peak power than it is reached for higher peak power.

By way of example, the above-described laser intra-cavity frequency-doubled OPS laser, which required 200 μs for stabilization at 2 mW set power compared with about 20 μs for stabilization at 20 mW set-power, was modified with the additional circuitry and components of FIG. 4 and FIG. 5. At set power levels of 20 mw, 10 mW, 5 mW, and 2 mW, stabilization times were 24 μs, 20 μs, 16 μs, and 18 μs, respectively. In the circuitry of FIG. 5, values for $R_2, R_3, R_4, R_5, R_6, R_7,$ and $R_8$ were 1000 Ohms, 10 Ohms, 1000 Ohms, 10 Ohms, 1000 Ohms, 10,000 Ohms, and 0.1 Ohms, respectively. Values for $C_1$ and $C_2$ were 3.3 nanofarads and 100 picofarads, respectively. Diodes $D_1$ and $D_2$ were each type 1PS76SB10 diodes, available from Philips NV of Eindhoven, Holland.

It should be noted, here, that functional electronic circuitry described above for implementing the inventive method of operation of a digitally modulated diode-pumped solid-state laser is merely one example of such circuitry. Those skilled in the electronic art, from the description of the present invention provided herein may devise other circuitry for implementing the inventive operation method without departing from the spirit and scope of the present invention.

In summary, the present invention is described above with reference to a preferred embodiment. The invention, however, is not limited to the embodiment described. Rather, the invention is limited only by the claims appended hereto.

What is claimed is:

1. A method of operating a digitally modulated laser energized by a diode-laser radiation source, the diode-laser radiation source being powered by current from a current source, and output power of the laser being controllable by a light regulator arrangement and a current regulator arrangement both cooperative with the current source, the method comprising the steps of:
   at the start of a pulse, enabling the current regulator and disabling the light regulator arrangement;
   with the light regulator arrangement disabled, controlling the current from the current-source based on input from the current regulator arrangement until output power of the laser reaches a predetermined value; then
   enabling the light regulator arrangement and controlling the laser output power using the light regulator arrangement to control current delivered by the current-source.

2. The method of claim 1, wherein the laser output power controlling is such that the laser output power remains about constant at the predetermined value.

3. The method of claim 1 further including the step of terminating delivery of current to the diode-laser radiation source after the light regulator arrangement has controlled the laser power for a predetermined time period, thereby terminating delivery of the laser power.

4. The method of claim 1, wherein the current from the current source is increased at a predetermined rate.

5. Optical apparatus comprising:
   a laser;
   a diode-laser radiation source for energizing the laser to provide laser output power;
   a current-source for delivering current for powering the diode-laser radiation source;
   a light regulator arrangement cooperative with the current-source for controlling current delivered by the current-source to the diode-laser radiation source;
   a power monitor arrangement for monitoring the output power of the laser, the power monitor arrangement being cooperative with the light regulator arrangement; and
   wherein, the output power monitor arrangement and the light regulator arrangement are configured such that, when the laser is turned on, the light regulator arrangement is disabled, current from the current supply to the diode-laser radiation source is increased until the monitored laser output power reaches a predetermined value, then the light regulator arrangement is enabled and controls the laser output power by controlling current delivered to the diode-laser radiation source by the current supply, said apparatus further including a current regulator arrangement cooperative with the current-supply and wherein the current regulator arrangement is arranged to control the increase of current delivered by the current-source until the laser output power reaches the predetermined level.

6. The apparatus of claim 5, wherein the light regulator arrangement controls the current delivered by the current supply to the diode-laser radiation source such that the output power remains about constant for a predetermined time period.

7. The apparatus of claim 5, further including a current sensor cooperative with the current regulator arrangement and arranged to monitor current delivered by the diode-laser, and wherein while the light regulator arrangement is controlling the laser output power the current regulator arrangement is arranged to prevent the monitored current from exceeding a predetermined upper limit value.

8. Optical apparatus comprising:
   a laser;
   a diode-laser radiation source for energizing the laser to provide laser output power;
   a current-source for delivering current for powering the diode-laser radiation source;
   a current regulator cooperative with the current source;
   a current monitor cooperative with the current regulator;
   a light regulator arrangement cooperative with the current-source for controlling current delivered by the current-source to the diode-laser radiation source;
   a power monitor arrangement for monitoring the output power of the laser, the power monitor arrangement being cooperative with the light regulator arrangement; and
   wherein, the output power monitor arrangement the light regulator arrangement the current regulator and the current monitor are configured such that, when the laser is turned on, the light regulator arrangement is disabled, the current source is enabled and monitored current from the current supply to the diode-laser radiation source is increased by the current regulator until the monitored laser output power reaches a predetermined value, then the light regulator arrangement is enabled and maintains the monitored laser power at about the predetermined level by controlling current delivered to the diode-laser radiation source by the current supply.

9. The laser of claim 8, wherein the current regulator is arranged such that while the light regulator arrangement is controlling the laser output power the current regulator is arranged to prevent the monitored current from exceeding a predetermined upper limit value.

10. The method of claim 1, wherein the current regulator remains enabled while the light regulator arrangement is enabled during which time, the current regulator arrangement functions as a current limiter to protect the diode laser radiation source from excess current.

* * * * *